United States Patent
Kodama

(10) Patent No.: US 8,941,515 B1
(45) Date of Patent: Jan. 27, 2015

(54) ENCODER, DECODER AND DATA PROCESSING SYSTEM

(71) Applicant: Kabushiki Kaisha Toshiba, Minato-ku, Tokyo (JP)

(72) Inventor: Sho Kodama, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/172,730

(22) Filed: Feb. 4, 2014

(30) Foreign Application Priority Data

Sep. 17, 2013 (JP) ................. 2013-192070

(51) Int. Cl.
*H03M 7/40* (2006.01)
*H03M 7/42* (2006.01)
*H04N 19/176* (2014.01)
*H04N 19/61* (2014.01)
*H03M 7/30* (2006.01)

(52) U.S. Cl.
CPC . *H03M 7/42* (2013.01); *H03M 7/40* (2013.01); *H04N 7/26244* (2013.01); *H04N 7/50* (2013.01); *H03M 7/30* (2013.01)
USPC .............................................. 341/67; 341/65

(58) Field of Classification Search
CPC ........... H03M 7/42; H03M 7/40; H03M 7/30; H04N 7/26244; H04N 7/50
USPC ........ 341/67, 65, 51; 375/240, 240.2, 240.25, 375/240.23
See application file for complete search history.

(56) References Cited

U.S. PATENT DOCUMENTS

| 7,161,509 B2 | 1/2007 | Naito |
| 7,924,179 B2 | 4/2011 | Kumura |
| 2008/0111722 A1* | 5/2008 | Reznik ........................ 341/67 |
| 2011/0158323 A1 | 6/2011 | Chen et al. |

FOREIGN PATENT DOCUMENTS

| EP | 2164176 | 3/2010 |
| JP | 2006-157157 | 6/2006 |
| JP | WO 2007/108395 | 9/2007 |
| JP | 2010-050697 | 3/2010 |
| JP | 2012-502573 | 1/2012 |

* cited by examiner

*Primary Examiner* — Joseph Lauture
(74) *Attorney, Agent, or Firm* — Knobbe, Martens, Olson & Bear, LLP

(57) ABSTRACT

According to one embodiment, a data processing system has an encoder and a decoder. The encoder is configured to variable-length encode input data to generate an encoded stream. The decoder is configured to decode the encoded stream to generate output data. The encoder has a variable length encoder, a code converter, and a buffer. The variable length encoder is configured to variable-length-encode the input data to generate first variable length codes. The code converter is configured to convert n first variable length codes into a second variable length code. The buffer is configured to buffer the second variable length code to generate the encoded stream.

20 Claims, 17 Drawing Sheets

| INPUT DATA | VLC | |
|---|---|---|
| | Pre | Suf |
| 0 | 1b'1 | 1b'0 |
| 1 | | 1b'1 |
| 2 | 2b'01 | 1b'0 |
| 3 | | 1b'1 |
| 4 | 3b'001 | 1b'0 |
| 5 | | 1b'1 |
| 6 | 4b'0001 | 1b'0 |
| 7 | | 1b'1 |
| 8 | 5b'00001 | 1b'0 |
| 9 | | 1b'1 |

FIG. 3

| Pre0 & Pre1 & Pre2 | Pre-T | Suf-T | GROUP | CODE LENGTH OF VLC-T |
|---|---|---|---|---|
| 111 | 1 | | D0 | 4 |
| 1101 | | 00 | | |
| 1011 | 01 | 01 | D1 | 7 |
| 0111 | | 10 | | |
| 10101 | | 000 | | |
| 10011 | | 001 | | |
| 11001 | 001 | 010 | D2 | 9 |
| 01101 | | 011 | | |
| 01011 | | 100 | | |
| 00111 | | 101 | | |
| 101001 | 0001 | 0000 | D3 | 11 |
| ⋮ | ⋮ | ⋮ | ⋮ | ⋮ |
| 000010000100001 | | | | |

| Pre0 & Pre1 & Pre2 | VLC-T | GROUP | DEGRADATION |
|---|---|---|---|
| 111 | 100 | D0 | |
| 1101 | 101 | | 0 |
| 1011 | 110 | D1 | |
| 0111 | 111 | | |
| 11001 | 010000 | | |
| 10101 | 010001 | | |
| 10011 | 010010 | D2 | 1 |
| 01101 | 010011 | | |
| 01011 | 010100 | | |
| 00111 | 010101 | | |
| 110001 | 010110 | | |
| 101001 | 010111 | | |
| 100101 | 011000 | | |
| 100011 | 011001 | | |
| 011001 | 011010 | D3 | 0 |
| 010101 | 011011 | | |
| 010011 | 011100 | | |
| 001101 | 011101 | | |
| 001011 | 011110 | | |
| 000111 | 011111 | | |
| 1100001 | 001000000 | | |
| 1010001 | 001000001 | | |
| 0110001 | 001000010 | | |
| 0101001 | 001000011 | | |
| 1001001 | 001000100 | | |
| 1000101 | 001000101 | | |
| 1000011 | 001000110 | | |
| 0100101 | 001000111 | D4 | 2 |
| 0100011 | 001001000 | | |
| 0011001 | 001001001 | | |
| 0010101 | 001001010 | | |
| 0010011 | 001001011 | | |
| 0001101 | 001001100 | | |
| 0001011 | 001001101 | | |
| 0000111 | 001001110 | | |

FROM FIG.10

| Pre0 & Pre1 & Pre2 | VLC-T | GROUP | DEGRADATION |
|---|---|---|---|
| 10100001 | 001001111 | | |
| 10010001 | 001010000 | | |
| 10001001 | 001010001 | | |
| 10000101 | 001010010 | | |
| 01100001 | 001010011 | | |
| 01010001 | 001010100 | | |
| 01001001 | 001010101 | | |
| 01000101 | 001010110 | | |
| 01000011 | 001010111 | D5 | 1 |
| 00110001 | 001011000 | | |
| 00101001 | 001011001 | | |
| 00100101 | 001011010 | | |
| 00100011 | 001011011 | | |
| 00011001 | 001011100 | | |
| 00010101 | 001011101 | | |
| 00010011 | 001011110 | | |
| 00001101 | 001011111 | | |
| 00001011 | 001100000 | | |
| 000100011 | 0001000000 | | |
| 100010001 | 0001000001 | | |
| 000101001 | 0001000010 | | |
| 000100101 | 0001000011 | | |
| 010010001 | 0001000100 | | |
| 010001001 | 0001000101 | | |
| 001000011 | 0001000110 | | |
| 010000101 | 0001000111 | | |
| 001100001 | 0001001000 | D6 | 1 |
| 001010001 | 0001001001 | | |
| 001000101 | 0001001011 | | |
| 000110001 | 0001001100 | | |
| 100100001 | 0001001101 | | |
| 010100001 | 0001001110 | | |
| 000011001 | 0001001111 | | |
| 000010101 | 0001010000 | | |
| 100001001 | 0001010001 | | |
| 000010011 | 0001010010 | | |

FROM FIG.11

| Pre0 & Pre1 & Pre2 | VLC-T | GROUP | DEGRADATION |
|---|---|---|---|
| 1000100001 | 0001010011 | D7 | 0 |
| 1000010001 | 0001010100 | | |
| 0100100001 | 0001010101 | | |
| 0100010001 | 0001010110 | | |
| 0100001001 | 0001010111 | | |
| 0010100001 | 0001011000 | | |
| 0010010001 | 0001011001 | | |
| 0010001001 | 0001011010 | | |
| 0000100011 | 0001011011 | | |
| 0000100101 | 0001011100 | | |
| 0010000101 | 0001011101 | | |
| 0001100001 | 0001011110 | | |
| 0001010001 | 0001011111 | | |
| 0001001001 | 0001100000 | | |
| 0001000101 | 0001100001 | | |
| 0001000011 | 0001100010 | | |
| 0000110001 | 0001100011 | | |
| 0000101001 | 0001100100 | | |
| 10000100001 | 0000100000 | D8 | 0 |
| 01000100001 | 0000100001 | | |
| 01000010001 | 0000100010 | | |
| 00100100001 | 0000100011 | | |
| 00100010001 | 0000100100 | | |
| 00100001001 | 0000100101 | | |
| 00010100001 | 0000100110 | | |
| 00010010001 | 0000100111 | | |
| 00010001001 | 0000101000 | | |
| 00010000101 | 0000101001 | | |
| 00001100001 | 0000101010 | | |
| 00001010001 | 0000101011 | | |
| 00001001001 | 0000101100 | | |
| 00001000101 | 0000101101 | | |
| 00001000011 | 0000101110 | | |

FROM FIG.12
↓

| Pre0 & Pre1 & Pre2 | VLC-T | GROUP | DEGRADATION |
|---|---|---|---|
| 010000100001 | 0000101111 | D9 | 0 |
| 001000100001 | 0000110000 | D9 | 0 |
| 001000010001 | 0000110001 | D9 | 0 |
| 000100100001 | 0000110010 | D9 | 0 |
| 000100010001 | 0000110011 | D9 | 0 |
| 000100001001 | 0000110100 | D9 | 0 |
| 000010100001 | 0000110101 | D9 | 0 |
| 000010010001 | 0000110110 | D9 | 0 |
| 000010001001 | 0000110111 | D9 | 0 |
| 000010000101 | 0000111000 | D9 | 0 |
| 0010000100001 | 0000010000 | D10 | 0 |
| 0001000100001 | 0000010001 | D10 | 0 |
| 0001000010001 | 0000010010 | D10 | 0 |
| 0000100100001 | 0000010011 | D10 | 0 |
| 0000100010001 | 0000010100 | D10 | 0 |
| 0000100001001 | 0000010101 | D10 | 0 |
| 00010000100001 | 0000010110 | D11 | 0 |
| 00001000100001 | 0000010111 | D11 | 0 |
| 00001000010001 | 0000010100 | D11 | 0 |
| 000010000100001 | 0000001 | D12 | 0 |

FIG. 13

| Pre-T | CODE LENGTH |
|---|---|
| 1 | 6 |
| 01 | 9 |
| 001 | 12 |
| 0001 | 13 |
| 00001 | 13 |
| 000001 | 13 |
| 0000001 | 10 |

FIG. 14

| INPUT DATA | VLC | |
| --- | --- | --- |
| | Prefix | Suffix |
| 0 | 1b' 1 | 1b' 0 |
| 1 | | 1b' 1 |
| 2 | 2b' 01 | 1b' 0 |
| 3 | | 1b' 1 |

FIG. 15

| Pre0 & Pre1 & Pre2 | GROUP |
| --- | --- |
| 111 | D0 |
| 1101 | D1 |
| 1011 | |
| 0111 | |
| 10101 | D2 |
| 01101 | |
| 01011 | |
| 010101 | D3 |

FIG. 16

| Pre0 & Pre1 & Pre2 | Pre-T | | CODE LENGTH OF VLC-T |
|---|---|---|---|
| 111 | 1 | | 4 |
| 1101 | 0111 | | 7 |
| 1011 | 0110 | | |
| 0111 | 010 | | 6 |
| 10101 | 00111 | | 8 |
| 01101 | 00110 | | |
| 01011 | 0010 | | 7 |
| 010101 | 000 | | 6 |

| VLC-T | CODE LENGTH |
|---|---|
| 1 | 4 |
| 010 | 6 |
| 011 | 7 |
| 0010 | 7 |
| 0011 | 8 |
| 000 | 6 |

ENCODER, DECODER AND DATA PROCESSING SYSTEM

CROSS REFERENCE TO RELATED APPLICATIONS

This application is based upon and claims the benefit of priority from the prior Japanese Patent Application No. 2013-192070, filed on Sep. 17, 2013, the entire contents of which are incorporated herein by reference.

FIELD

Embodiments described herein relate generally to an encoder, a decoder and a data processing system.

BACKGROUND

It is possible to shorten processing time by cutting out two or more variable length codes for each cycle when decoding an encoded stream obtained by variable-length-encoding input data. For this purpose, a plurality of variable length codes included in the encoded stream is packed to be processed in parallel. However, when a plurality of variable length codes is packed, the number of patterns of code lengths thereof increases.

If the number of patterns of code lengths increases, the number of entries of a table used for deriving the code length of the variable length code increases, and thus, delay in process might become greater.

BRIEF DESCRIPTION OF THE DRAWINGS

FIG. 3 is a view for illustrating an example of a process of the variable length encoder 11.

FIG. 5 is a view of an example of the conversion table 12a.

FIG. 9 is a view of an example of a procedure for generating the conversion table 12a.

FIGS. 10 to 13 are views of the conversion table 12a generated by the procedure in FIG. 9

FIG. 14 is a view of relationship between the prefix Pre-T and the code length.

FIG. 15 is a view of input/output relationship of a variable length encoder 11 in a case in which the input data is 0 to 3.

FIG. 16 is a view of combinations of prefixes Pre0 to Pre2 of codes VLC0 to VLC2.

FIG. 19 is a view of the conversion table 12a generated by the procedure in FIG. 17.

FIG. 20 is a view of relationship between the code VLC-T and the code length.

DETAILED DESCRIPTION

In general, according to one embodiment, a data processing system has an encoder and a decoder. The encoder is configured to variable-length encode input data to generate an encoded stream. The decoder is configured to decode the encoded stream to generate output data.

The encoder has a variable length encoder, a code converter, and a buffer. The variable length encoder is configured to variable-length-encode the input data to generate first variable length codes. The code converter is configured to convert n first variable length codes into a second variable length code. The buffer is configured to buffer the second variable length code to generate the encoded stream.

The decoder has a code length deriving module, a cutout module, a code reverse-converter, and a variable length decoder. The code length deriving module is configured to derive a code length of the second variable length code by using at least a part of the second variable length code as an index. The cutout module is configured to cut out the second variable length code from the encoded stream based on the derived code length. The code reverse-converter is configured to convert the second variable length code into the n first variable length codes. The variable length decoder is configured to decode the first variable length code to generate the output data.

A number of patterns of code lengths of the first variable length code is m. The number of indices is smaller than $m^n$. Hereinafter, embodiments are specifically described with reference to the drawings.

First Embodiment

Figure 1:
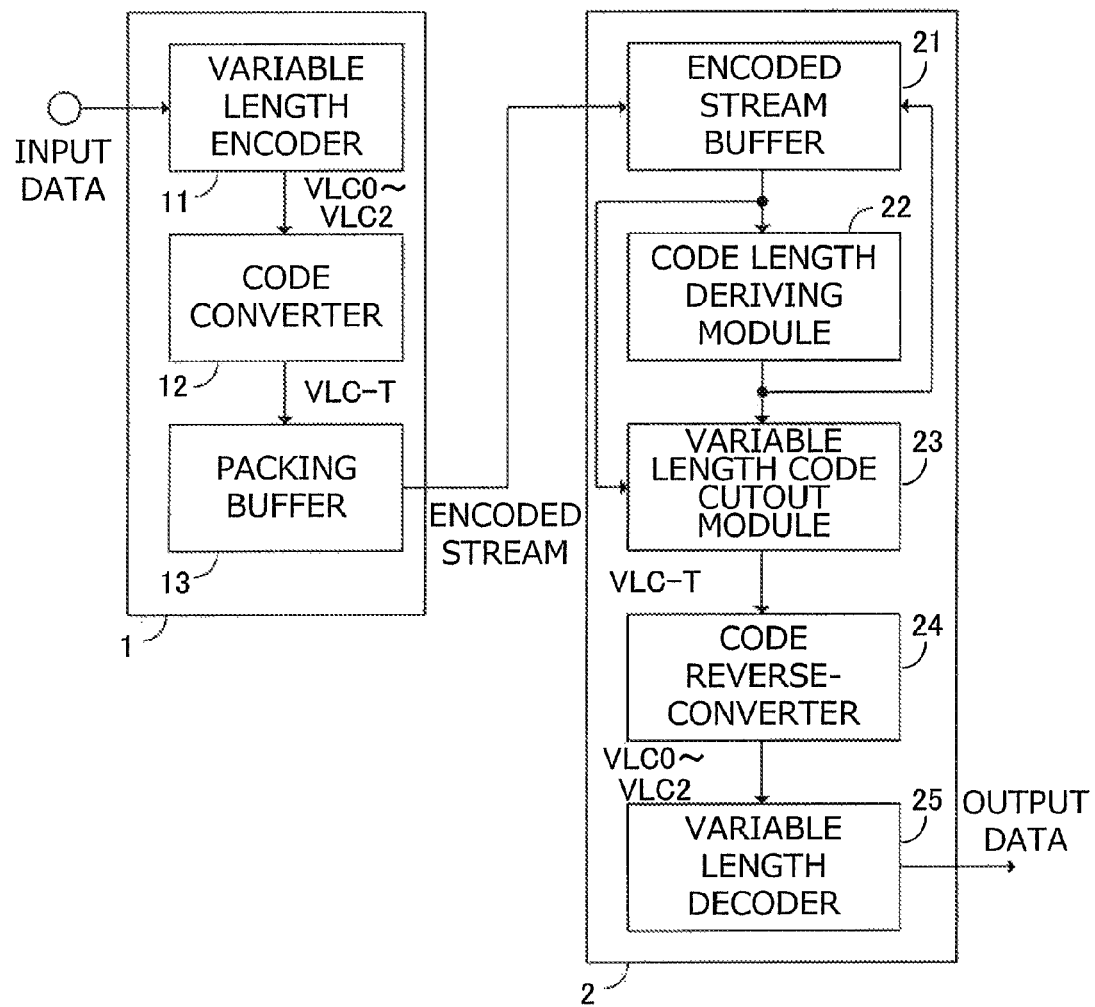
FIG. 1 is a block diagram of a schematic configuration of a data processing system according to a first embodiment.

FIG. 1 is a block diagram of a schematic configuration of a data processing system according to a first embodiment. A data processing system 100 is provided with an encoder 1 and a decoder 2. The data processing system 100 is configured to generate an encoded stream by encoding input data by the encoder 1, and to obtain output data by decoding the encoded stream by the decoder 2.

The encoder 1 will be described. The encoder 1 includes a variable length encoder 11, a code converter 12, and a packing buffer (output module) 13. The variable length encoder 11 performs Golomb-Rice encoding of the input data to generate a Golomb-Rice code (first variable length code) VLC. The code converter 12 converts n (n is an integer not smaller than 2) Golomb-Rice codes VLCs into one code (second variable length code) VLC-T. The packing buffer 13 buffers the code VLC-T and outputs the same as the encoded stream when a predetermined bit length is obtained.

Figure 2:
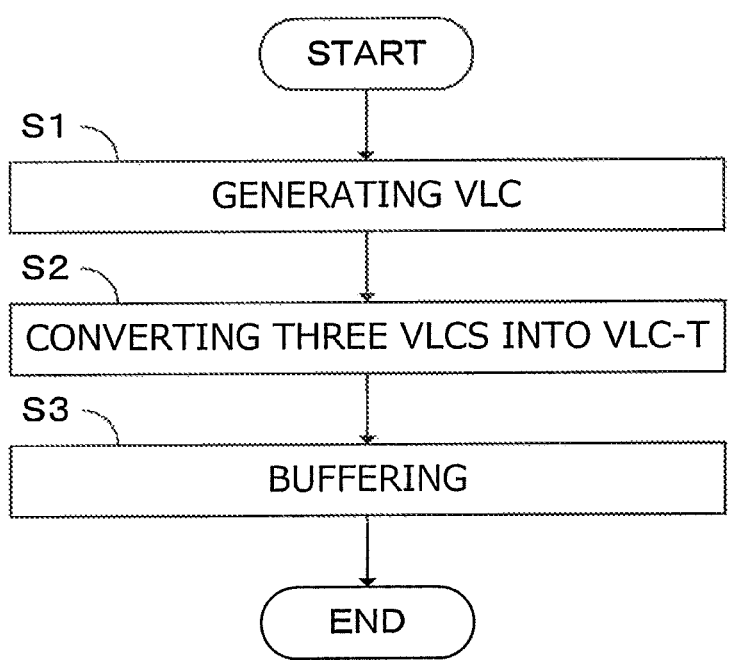
FIG. 2 is a flowchart of an example of processing operation of the encoder 1.

FIG. 2 is a flowchart of an example of processing operation of the encoder 1. The variable length encoder 11 first performs the Golomb-Rice encoding of the input data to generate the Golomb-Rice code VLC (S1).

FIG. 3 is a view for illustrating an example of a process of the variable length encoder 11 in which relationship between a value of the input data inputted to the variable length encoder 11 and a value of the code VLC outputted from the variable length encoder 11 is illustrated. The code VLC is formed of a variable length prefix Pre and a fixed length suffix Suf and a least significant bit thereof is the suffix Suf. Meanwhile, in FIG. 3, the input data is assumed to be one of ten values from 0 to 9. In this case, the code VLC may have five patterns of code lengths of 2 to 6.

When the input data is 0 and 1, the prefix Pre is 1-bit "1". When the input data is 2 or larger, the prefix Pre has a value obtained by combining ceil {(input data−1)/2}-bit "0" and one "1" (ceil {x} is a ceiling function and {x} represents a minimum integer not smaller than x). The suffix Suf is a 1-bit value which is "0" when the input data is an even number and "1" when this is an odd number. When the input data is 2, for example, prefix Pre="01" and suffix Suf="0", so that VLC="010". Next, the code converter 12 packs three codes VLCs to convert the packed three codes VLCs into one code VLC-T (S2). A high-speed process at the time of decoding may be realized by packing a plurality of codes. Hereinafter, the three codes VLCs are made VLC0, VLC1, and VLC2, prefixes thereof are made Pre0 to Pre2 and suffixes thereof are made Suf0 to Suf2. The packing buffer 13 buffers the generated code VLC-T (S3) and outputs the same as the encoded stream.

Figure 4:
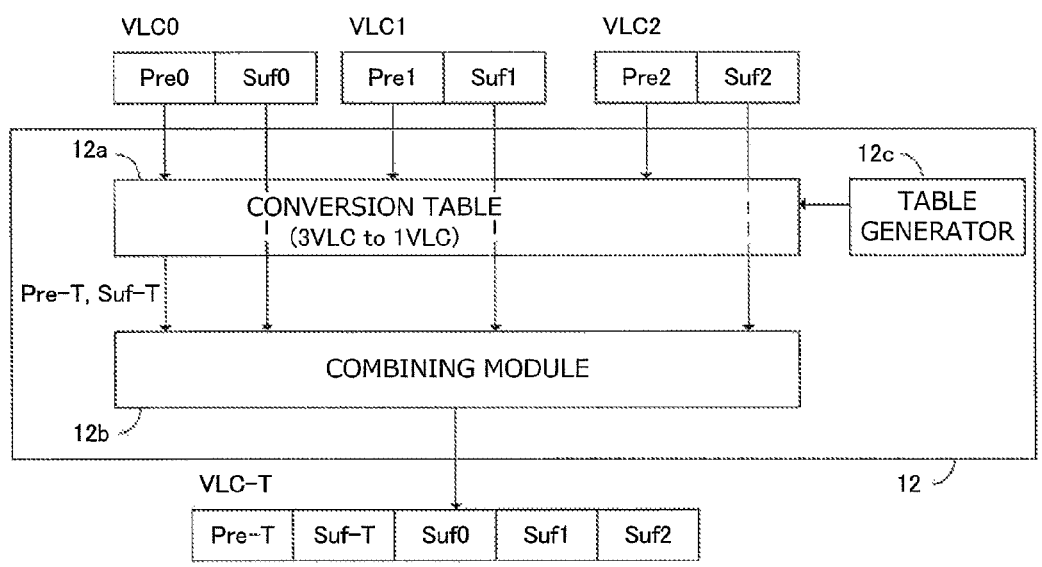
FIG. 4 is a block diagram of an example of an internal configuration of the code converter 12.

FIG. 4 is a block diagram of an example of an internal configuration of the code converter 12. The code converter 12 includes a conversion table 12a, a combining module 12b, and a table generator 12c.

The conversion table 12a generates a prefix Pre-T and a suffix Suf-T of the code VLC-T from the prefixes Pre0 to Pre2 of the codes VLC0 to VLC2, respectively. The lengths of the prefix Pre-T and the suffix Suf-T are variable.

The combining module 12b combines the generated prefix Pre-T and suffix Suf-T and the suffixes Suf0 to Suf2 to generate the code VLC-T. That is to say, the code VLC-T is formed of the variable length prefix Pre-T and suffix Suf-T and fixed length suffixes Suf0 to Suf2. Therefore, a code length of the code VLC-T is obtained by adding 3 bits of the suffixes Suf0 to Suf2 to a bit length of the prefix Pre-T and a bit length of the suffix Suf-T.

FIG. 5 is a view of an example of the conversion table 12a. The conversion table 12a specifies the prefix Pre-T and the suffix Suf-T from the prefixes Pre0 to Pre2. Such relationship between the prefixes Pre0 to Pre2 and the prefix Pre-T and suffix Suf-T is generated by the table generator 12c in advance. Meanwhile, "group" and "code length of VLC-T" are also illustrated in FIG. 5.

As an example, in a case of (VLC0, VLC1, VLC2)=("010", "011", "11"), "01011" is obtained by combining the prefixes Pre0 to Pre2, so that Pre-T="001" and Suf-T="100". As a result, VLC-T ="001100011".

Figure 6:
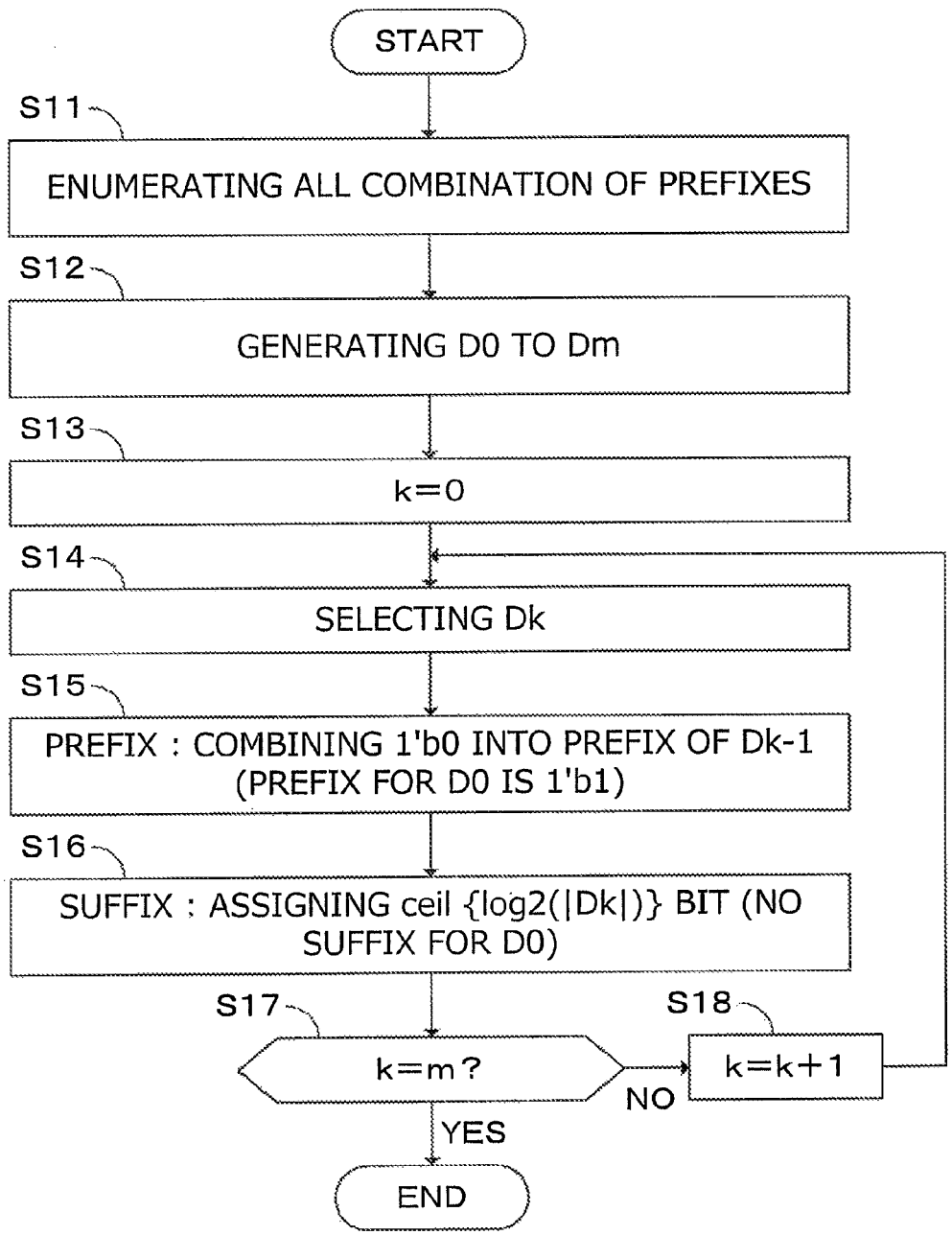
FIG. 6 is a flowchart of an example of a procedure for generating the conversion table 12a in FIG. 5.

FIG. 6 is a flowchart of an example of a procedure for generating the conversion table 12a in FIG. 5. First, all combinations of the prefixes (Pre0 & Pre1 & Pre2) generated by the three codes VLC0 to VLC2 are enumerated (S11). In the example in FIG. 3, there are five patterns of prefixes, so that $5^3$=125 types of combinations of the prefixes are generated by the codes VLC0 to VLC2.

Subsequently, the combinations having a same total bit length among the generated combinations of three prefixes (Pre0 & Pre1 & Pre2) are grouped and groups D0 to Dm are generated by the table generator 12c (S12). Meanwhile, the above-described total bit length becomes longer in order from the group D0 to group Dm. In the example in FIG. 3, the total bit length of the combination of the prefixes (Pre0 & Pre1 & Pre2) is 3 bits at a minimum and 15 bits at a maximum, and 13 groups D0 to D12 are generated. An initial value of k is set to 0 (S13) and the table generator 12c sequentially selects a group Dk (S14).

The prefix Pre-T and the suffix Suf-T are assigned to the group Dk in a following manner. The prefix Pre-T of the group Dk is obtained by combining "0" with a most significant bit of the prefix of a group Dk−1 (S15). Then, the suffix Suf-T having the bit length of ceil {log 2(|Dk|)} is assigned to the combination of the prefixes included in the group Dk (S16). Herein, |Dk| represents the number of combinations included in the group Dk. However, Pre-T of the group D0 is set to "1" (S15). The suffix is not assigned to the group D0 (S16).

For example, the prefix Pre-T of the group D1 is obtained as Pre-T="01" by combining "0" with the most significant bit of the prefix "1" of the group D0 (S15). The suffix Suf-T has the bit length of ceil {log 2(|D1|)}=2 bits for the number of combinations included in the group D1 |D1|=4. The table generator 12c assigns the suffixes Suf-T "00", "01", and "10" to the combinations of the prefixes (Pre0 & Pre1 & Pre2) ="1101", "1011", and "0111" in the group D1, respectively (S16).

Hereinafter, the prefix Pre-T and the suffix Suf-T are assigned to all the groups D0 to Dm while incrementing k by 1 (S17 and S18). According to this, an inherent prefix Pre-T of different bit length is assigned to each of the groups D0 to Dm.

The conversion table 12a illustrated in FIG. 5 is generated in the above-described manner. In FIG. 5, it should be noted that there is one-to-one correspondence between the value of the prefix Pre-T and the code length of the code VLC-T. For example, when the prefix Pre-T is "1", the code length of the code VLC-T has 4 bits. When the prefix Pre-T is "01", the code length of the code VLC-T has 7 bits. According to this, it is possible to derive the code length of the code VLC-T by using the prefix Pre-T of the code VLC-T as an index.

Subsequently, the decoder 2 will be described. The decoder 2 includes an encoded stream buffer 21, a code length deriving module 22, a variable length code cutout module 23, a code reverse-converter 24, and a variable length decoder 25.

The encoded stream buffer 21 buffers the encoded stream and shifts the encoded stream by the code length of the variable length code. The code length deriving module 22 derives the code length of each code VLC-T included in the encoded stream. The code length is supplied to the encoded stream buffer 21 and the variable length code cutout module 23.

The variable length code cutout module 23 cuts out each code VLC-T from the encoded stream based on the supplied code length. The code reverse-converter 24 performs a process opposite to that of the code converter 12 on the code VLC-T to generate the Golomb-Rice codes VLC0 to VLC2. The variable length decoder 25 performs Golomb-Rice decoding of the Golomb-Rice code VLC to generate the output data.

Figures 7, 8:
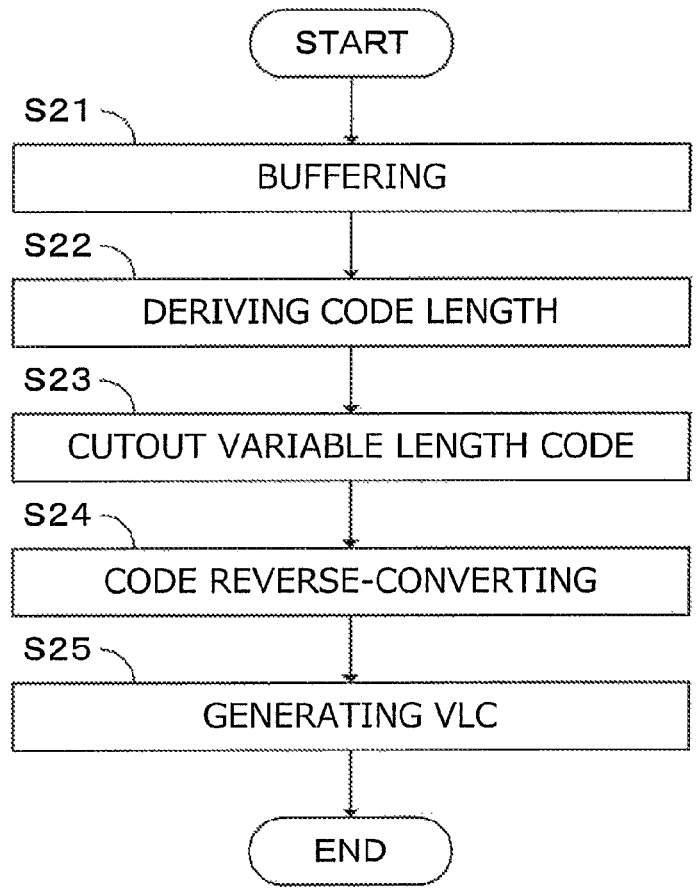
FIG. 7 is a flowchart of an example of a process of the decoder 2.
FIG. 8 is a view of relationship between the prefix Pre-T and the code length.

FIG. 7 is a flowchart of an example of a process of the decoder 2. First, the encoded stream buffer 21 buffers the encoded stream (S21). Subsequently, the code length deriving module 22 refers to the prefix Pre-T in the encoded stream to derive the code length of each code VLC-T (S22). Meanwhile, as is clear from FIG. 5, in the code VLC-T, a part from the top to first "1" is the prefix Pre-T. FIG. 8 is a view of relationship between the prefix Pre-T and the code length. There is one-to-one correspondence between the value of the prefix Pre-T and the code length of the code VLC-T. Therefore, the code length deriving module 22 may detect the prefix Pre-T in the encoded stream and may uniquely derive the code length of the code VLC-T by using the prefix Pre-T as the index. When the code length is derived, the variable length code cutout module 23 cuts out the code VLC-T from the encoded stream (S23).

In this embodiment, the number of entries in the table for deriving the code length is 13. The number of entries corresponds to the number of groups. If the code converter 12 does not perform a converting process at the time of encoding, there are $5^3$=125 types of prefixes of the three codes VLCs having five patterns of code lengths. That is to say, the table having 125 entries is required for deriving the code length. In more general, when there are m patterns of code lengths of the code VLC and one code VLC-T is generated from n codes VLCs, entries are required.

On the other hand, in this embodiment, the codes VLC0 to VLC2 are converted into the code VLC-T having the prefix Pre-T corresponding to the total bit length of the combination of the prefixes Pre0 to Pre2. There are 13 types, namely from 3 to 15, of total bit lengths of the combinations of the prefixes Pre0 to Pre2, so that the number of entries of the table may be reduced to 13. That is to say, in this embodiment, the number of entries may be made smaller than the general number of entries $m^n$.

Subsequently, the code reverse-converter 24 performs the process opposite to that of the code converter 12 to the code VLC-T to generate the Golomb-Rice codes VLC0 to VLC2 (S24). Specifically, the code reverse-converter 24 first refers to a conversion table to specify the suffix Suf-T from the prefix Pre-T. For example, when prefix Pre-T="001", the bit length of the suffix Suf-T is 3 bits and it is possible to specify the value of the suffix Suf-T. Meanwhile, as the conversion table to be referred to, the code reverse-converter 24 may have the conversion table similar to the conversion table 12a in advance or the conversion table may be is generated by using a table generator similar to the code converter 12.

Further, the code reverse-converter 24 specifies the prefixes Pre0 to Pre2 forming VLC0 to VLC2, respectively, from the prefix Pre-T and the suffix Suf-T. For example, when prefix Pre-T="001" and suffix Suf-T="001", (Pre0, Pre1, Pre2)=("1", "001", "1").

Then, the code reverse-converter 24 specifies the suffixes Suf0 to Suf2 forming the codes VLC0 to VLC2, respectively, from the bits added after the suffix Suf-T of the code VLC-T. From above, the code reverse-converter 24 may obtain the three codes VLC0 to VLC2 from the code VLC-T. Then, the variable length decoder 25 performs the Golomb-Rice decoding of the Golomb-Rice codes VLC0 to VLC2 to generate the output data (S25).

In the first embodiment, the codes VLC0 to VLC2 are converted into the code VLC-T including the prefix Pre-T corresponding to a total sum of prefix lengths thereof. Therefore, the code length may be easily derived by the table having a small number of entries at the time of decoding.

Second Embodiment

In a second embodiment, a conversion table 12a is different from that of the first embodiment. Hereinafter, differences from the first embodiment will be mainly described.

A schematic configuration of a data processing system of this embodiment is substantially similar to that illustrated in FIGS. 1 and 4. A procedure of generating the conversion table 12a by a table generator 12c is different from that of the first embodiment.

Figure 9:
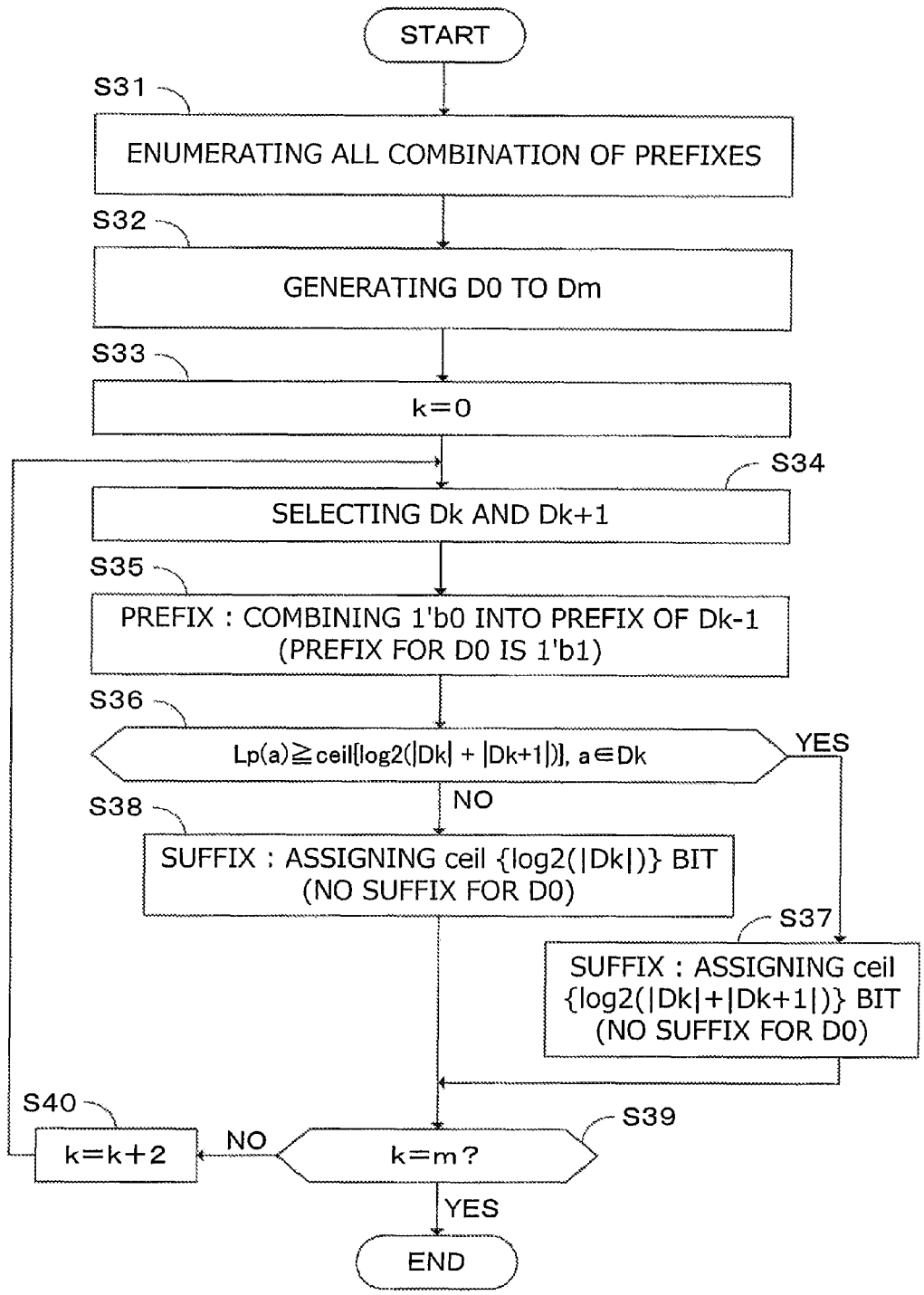

FIG. 9 is a view of an example of a procedure for generating the conversion table 12a. FIGS. 10 to 13 are views of the conversion table 12a generated by the procedure in FIG. 9. S31 to S33 in FIG. 9 are similar to S11 to S13 in FIG. 6. Subsequently, the table generator 12c selects two groups Dk and Dk+1 whose total bit lengths of combinations of prefixes are consecutive (S34). A prefix Pre-T and a suffix Suf-T are assigned to every two groups Dk and Dk+1 in a following manner.

The prefix Pre-T is similar to that of the first embodiment (S35). The table generator 12c determines whether following equation (1) is satisfied (S36).

$$Lp(a) \geq \mathrm{ceil}\{\log 2(|Dk|+|Dk+1|)\}, a \in Dk \quad (1)$$

A left member Lp(a) of equation (1) represents the total bit length of the combination of the prefixes in the group Dk. For example, in a case of k=0, that is to say, when groups D0 and D1 are selected, Lp(a)=3.

When equation (1) is satisfied, the table generator 12c sets a bit length of the suffix Suf-T to ceil $\{\log 2(|Dk|+|Dk+1|)\}$ bits (S37). On the other hand, when equation (1) is not satisfied, the table generator 12c sets the bit length of the suffix Suf-T for Dk and Dk+1 to ceil $\{\log 2(|Dk|)\}$ bits and ceil $\{\log 2(|Dk+1|)\}$ bits, respectively (S38). Then, the table generator 12c assigns an inherent value to each combination included in the groups Dk and Dk+1.

When equation (1) is not satisfied, following equation (1') holds.

$$Lp(a) \geq \mathrm{ceil}\{\log 2(|Dk|+|Dk+1|)\}, a \in Dk \quad (1')$$

A right member of equation (1') being the bit length of Suf-T corresponding to groups Dk and Dk+1 is larger than Lp(a), so that a compression rate is degraded as a result of code conversion regarding at least the group Dk. The degradation is represented as Pre-T+Suf-T−Lp(a). Therefore, in such a case, it is tried to reduce bits of Suf-T for Dk by setting the suffix length of Dk not to equation (1) but to ceil $\{\log 2(|Dk|)\}$. Although the compression rate might be further degraded regarding Dk+1, an original code length of Dk is shorter than that of Dk+1 in consideration of selecting order of the group and generation probability of shorter code is higher as a precondition to the variable length code, so that Suf-T for Dk is preferentially reduced.

The above-described process is performed for every group (S39 and S40).

In this embodiment, one inherent prefix Pre-T is assigned to every two groups. There is one-to-one correspondence between the prefix Pre-T and a code length of a code VLC-T.

As for the group D0, the code length of the code VLC-T is 6 while a total code length of the codes VLC0 to VLC2 is 6. The compression rate is not degraded by the conversion into the code VLC-T. As for the group D1 also, the compression rate is not degraded by the conversion into the code VLC-T.

As for a group D2, the code length of the code VLC-T is 9 while the total code length of the codes VLC0 to VLC2 is 8. The compression rate is merely degraded by 1 bit by the conversion into the code VLC-T. As for another group also, the compression rate is merely degraded by 2 bits at a maximum by the conversion into the code VLC-T.

In this manner, according to the method of this embodiment, the degradation in compression rate may be inhibited as compared to the first embodiment. FIG. 14 is a view of relationship between the prefix Pre-T and the code length. In this embodiment, the number of entries may be reduced to seven and the code length of the code VLC-T may be derived by using the prefix Pre-T as an index.

In the second embodiment, one prefix Pre-T is assigned to every two consecutive groups and the bit length of the suffix Suf-T is set based on equation (1). Therefore, the degradation in compression rate when the codes VLC0 to VLC2 are converted into one code VLC-T may be inhibited and the number of entries may be reduced.

Third Embodiment

In a third embodiment, a conversion table 12a is generated by using a binary tree. Hereinafter, differences from the first and second embodiments will be mainly described.

In order to simplify the description, in this embodiment, it is supposed that input data may be one of four values from 0 to 3.

FIG. 15 is a view of input/output relationship of a variable length encoder 11 in a case in which the input data is 0 to 3. FIG. 16 is a view of combinations of prefixes Pre0 to Pre2 of codes VLC0 to VLC2. A total bit length of the combination includes four types of 3 to 6 bits and they are made groups D0 to D3, respectively.

Figure 17:
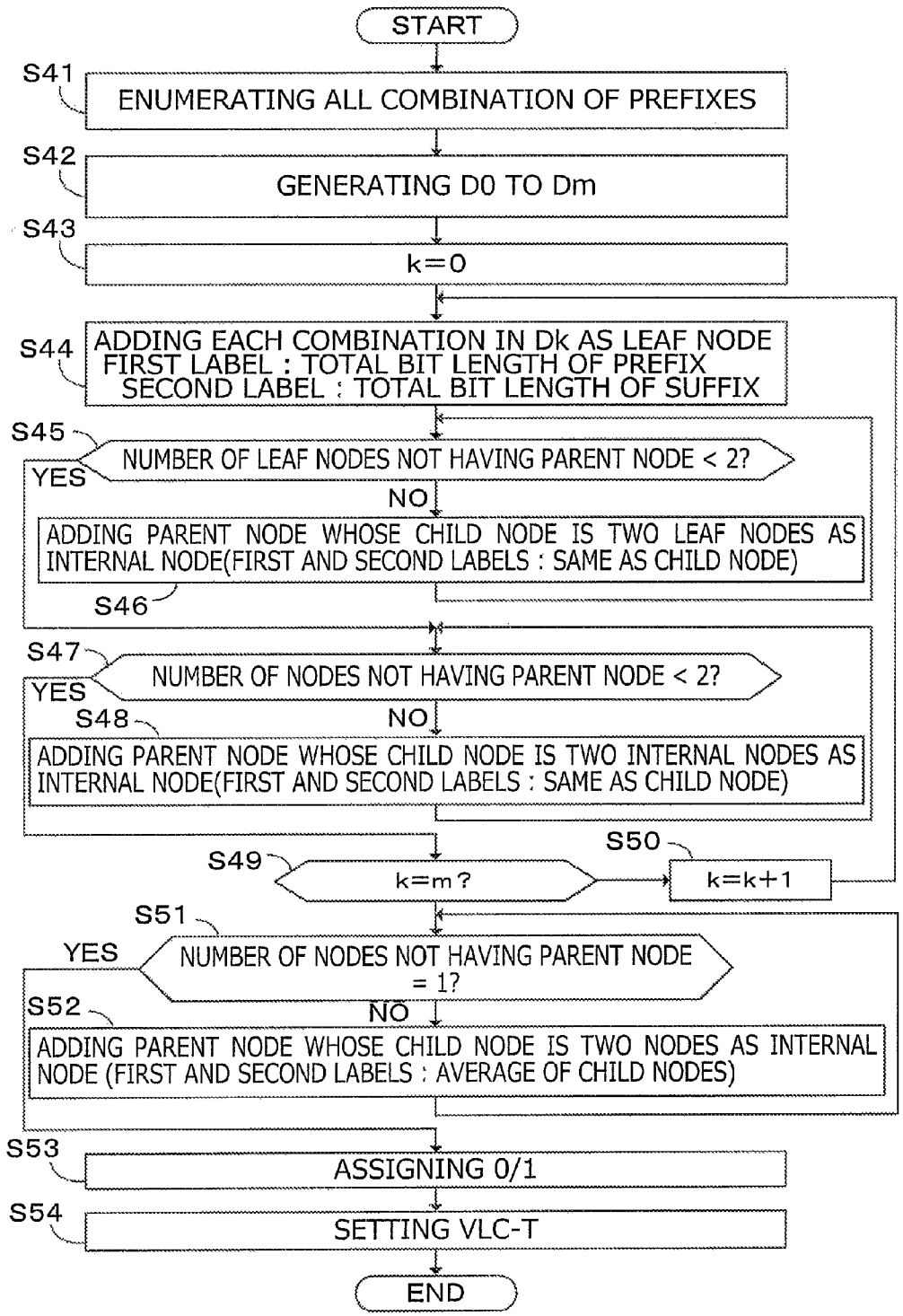
FIG. 17 is a flowchart of an example of a procedure for generating the conversion table 12a by using the binary tree.
Figure 18:
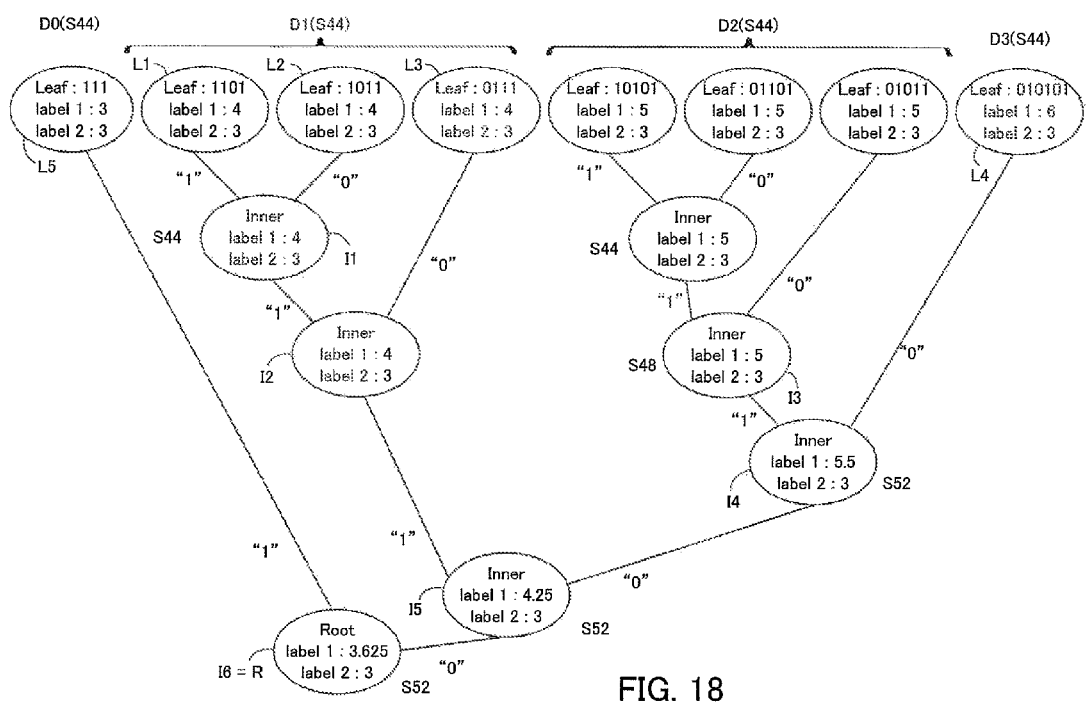
FIG. 18 is a view of the binary tree based on the procedure in FIG. 17.

FIG. 17 is a flowchart of an example of a procedure for generating the conversion table 12a by using the binary tree. FIG. 18 is a view of the binary tree based on the procedure in FIG. 17. Further, FIG. 19 is a view of the conversion table 12a generated by the procedure in FIG. 17. Meanwhile, in this embodiment, it is also possible that a code VLC-T generated by a code converter 12 does not include a suffix Suf-T.

S41 to S43 in FIG. 17 are similar to S11 to S13 in FIG. 6, respectively. A table generator 12c performs a following process at S44 to S48 for a group Dk.

First, the table generator 12c adds a leaf node corresponding to each combination (S44). Each leaf node includes a first label and a second label. The first label is the total bit length of the prefixes in the group Dk. The second label is a total bit length of the suffix of the group Dk, that is to say, 3. For example, three combinations "1101", "1011", and "0111" are included in the group D1, so that three leaf nodes L1 to L3 illustrated in FIG. 18 are added. The first label is 4 and the second label is 3.

Subsequently, the table generator 12c adds a parent node whose child nodes are optional two leaf nodes as an internal node (S46) until the number of leaf nodes which does not have the parent node becomes smaller than two (S45). At that time, the first and second labels of the child nodes are taken over as the first and second labels of the internal node. For example, in the group D1, at first, there are three leaf nodes L1 to L3 which do not have the parent node. Therefore, the parent node whose child nodes are the leaf nodes L1 and L2 is added as an internal node I1 illustrated in FIG. 18, for example. According to this, only the leaf node L3 does not have the parent node.

Subsequently, the table generator 12c selects two nodes (when simply referred to as the "node", this may be any of the internal node and the leaf node, the same applies hereinafter) which do not have the parent node until the number of nodes which do not have the parent node becomes smaller than two (S47) and further adds the parent node whose child nodes are the two nodes as the internal node (S48). When there is a plurality of internal nodes and leaf nodes which do not have the parent node, the leaf node is preferentially selected. At that time, the first and second labels of the child nodes are taken over as the first and second labels of the internal node. In an example of the group D1, at first, there are two nodes which do not have the parent node: the internal node I1 and the leaf node L3. Therefore, the parent node whose child nodes are the internal node I1 and the leaf node L3 is added as an internal node I2 in FIG. 18. According to this, only the internal node I2 does not have the parent node.

The above-described process is performed for all groups D0 to Dm (S49 and S50). Subsequently, the table generator 12c performs a following process at S51 to S54 across the groups.

The table generator 12c selects two nodes which do not have the parent node until the number of nodes which do not have the parent node becomes one (S51) and adds the parent node whose child nodes are the two nodes as the internal node (S52). Two nodes are selected in descending order of a value of the first label as a selection criterion. When there is a plurality of nodes having a maximum value of the first label, two nodes are selected in descending order of a value of the second label therefrom. The first and second labels of the internal node are average values of the first and second labels of the child nodes. The internal node generated at the end becomes a root node and the binary tree is completed. For example, in FIG. 18, the parent node whose child nodes are an internal node I3 for the group D2 and a leaf node L4 for the group D3 is added as an internal node I4. Subsequently, the parent node whose child nodes are the internal nodes I2 and I4 is added as an internal node I5. Further, the parent node whose child nodes are a leaf node L5 for the group D0 and the internal node I5 is added as an internal node I6. At that time, only the internal node I6 does not have the parent node. Therefore, the internal node I6 becomes a root node R.

When the root node R is generated, the table generator 12c assigns "0" or "1" to each branch (S53). For example, "1" is assigned to the branch from the root node R to the leaf node L5 and "0" is assigned to the branch from the root node R to the internal node I5. To other branches also, "0" or "1" is assigned. Meanwhile, "0" and "1" are optionally assigned to the branches and it is not limited to that in FIG. 18.

Then, the table generator 12c follows the binary tree from the root node and sets the code VLC-T for each combination of the prefixes corresponding to the leaf node (S54). For example, "1" is assigned to the leaf node L5 (combination of the prefixes "111"). Also, "0111" is assigned to the leaf node L1 (combination of the prefixes "1101").

In the above-described manner, the conversion table 12a illustrated in FIG. 19 is generated. Meanwhile, the code VLC-T is obtained by combining suffixes Suf0 to Suf2 with the prefix Pre-T. Therefore, a code length of the code VLC-T is obtained by adding 3 bits of the suffixes Suf0 to Suf2 to a bit length of the prefix Pre-T. As is clear from FIG. 19, the bit number of the converted prefix Pre-T does not become larger than the total bit number of the combination of the prefixes Pre0 to Pre2 and degradation in compression rate by the conversion does not occur.

FIG. 20 is a view of relationship between the code VLC-T and the code length. In this embodiment, a code length deriving module 22 derives the code length based on the prefix Pre-T or a part of top bits thereof. For example, regardless of whether the prefix Pre-T is "0111" or "0110", the code length of the code VLC-T is 7 bits. Therefore, when top 3 bits of the code VLC-T are "011" (that is to say, regardless of whether a fourth bit is "0" or "1"), the code length of the code VLC-T is uniquely determined to be 7 bits.

If the code converter 12 does not convert, the code length deriving module 22 requires a table having eight entries. On the other hand, in this embodiment, the number of entries may be reduced to six as illustrated in FIG. 20.

In this manner, in the third embodiment, the conversion table 12a is generated by using the binary tree. Therefore, it is possible to reduce the number of entries of the table required for deriving the code length while inhibiting the degradation in compression rate by the conversion.

At least a part of the data processing system explained in the above embodiments can be formed of hardware or software. When the data processing system is partially formed of the software, it is possible to store a program implementing at least a partial function of the data processing system in a recording medium such as a flexible disc, CD-ROM, etc. and to execute the program by making a computer read the program. The recording medium is not limited to a removable medium such as a magnetic disk, optical disk, etc., and can be a fixed-type recording medium such as a hard disk device, memory, etc.

Further, a program realizing at least a partial function of the data processing system can be distributed through a communication line (including radio communication) such as the Internet etc. Furthermore, the program which is encrypted, modulated, or compressed can be distributed through a wired line or a radio link such as the Internet etc. or through the recording medium storing the program.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fail within the scope and spirit of the inventions.

The invention claimed is:

1. A data processing system comprising:
an encoder configured to variable-length encode input data to generate an encoded stream; and
a decoder configured to decode the encoded stream to generate output data,
wherein the encoder comprises:
a variable length encoder configured to variable-length-encode the input data to generate first variable length codes;
a code converter configured to convert n first variable length codes into a second variable length code; and
a buffer configured to buffer the second variable length code to generate the encoded stream,
the decoder comprises:
a code length deriving module configured to derive a code length of the second variable length code by using at least a part of the second variable length code as an index;
a cutout module configured to cut out the second variable length code from the encoded stream based on the derived code length;
a code reverse-converter configured to convert the second variable length code into the n first variable length codes; and
a variable length decoder configured to decode the first variable length code to generate the output data,
wherein a number of patterns of code lengths of the first variable length code is m and
a number of indices is smaller than $m^n$.

2. The data processing system of claim 1, wherein
the first variable length code comprises a first prefix of variable length, and
the second variable length code comprises a second prefix based on n first prefixes.

3. The data processing system of claim 2, wherein the second prefix corresponds to the code length of the second variable length code.

4. The data processing system of claim 2, wherein the code length of the second variable length code is capable of being derived by using the second prefix as the index.

5. The data processing system of claim 2, wherein
the second variable length code comprises the second prefix and a second suffix of variable length, and
the code converter comprises a conversion table configured to convert the n first prefixes into the second prefix and the second suffix.

6. The encoder of claim 5, wherein the code converter comprises a table generator configured to generate the conversion table, and
the table generator is configured to:
enumerate all combinations of the first prefixes generated by the first variable length codes;
group combinations having a same total bit length among the combinations to generate a group;
assign a different second prefix to each group;
set a bit length of the second suffix to ceil {log 2(|Dk|)} (herein, ceil represents a ceiling function and Dk represents the number of combinations belonging to the group) bits for each group; and
assign a different second suffix to each of the combinations belonging to the group to generate the conversion table.

7. The data processing system of claim 5, wherein the code converter comprises a table generator configured to generate the conversion table, and
the table generator is configured to:
enumerate all combinations of the first prefixes generated by the first variable length codes;
group combinations having a same total bit length among the combinations;
assign a different second prefix to each two consecutive groups;
set a bit length of the second suffix to ceil {log 2(|Dk|+ |Dk+1|)} (herein, ceil represents a ceiling function and |Dk| and |Dk+1| represent the number of combinations belonging to the consecutive two groups) for each consecutive two groups when following equation (1) is satisfied;
set the bit length of the second suffix to ceil {log 2(|Dk|)} for each consecutive two groups when following equation (1) is not satisfied; and
assign a different second suffix to each of the combinations belonging to the two consecutive groups to generate the conversion table $$Lp(a) \geq \text{ceil}\{\log 2(|Dk|+|Dk+1|)\}, a \in Dk \quad (1)$$

wherein Lp(a) represents a total bit length of a combination of the prefixes in a group Dk.

8. The data processing system of claim 5, wherein
the first variable length code comprises the first prefix and a first suffix of fixed length, and
the code converter combines n first suffixes with the second prefix and the second suffix to generate the second variable length code.

9. The data processing system of claim 2, wherein the code converter comprises a conversion table configured to convert the n first prefixes into the second prefix.

10. The data processing system of claim 9, wherein the code converter comprises a table generator configured to generate the conversion table, and
the table generator is configured to:
enumerates all combinations of the first prefixes generated by the first variable length codes;
makes each of the combinations a leaf node and adds an internal node and a root node based on total bit lengths of the combinations to generate a binary tree; and
assigns the second prefix to each of the combinations based on the binary tree to generate the conversion table.

11. An encoder comprising:
a variable length encoder configured to variable-length-encode input data to generate first variable length codes;
a code converter configured to convert n first variable length codes into a second variable length code; and
an output module configured to generate an encoded stream from the second variable length code, wherein a number of patterns of code lengths of the first variable length code is m,
a code length of the second variable length code is capable of being derived by using at least a part of the second variable length code as an index, and
the number of indices is smaller than $m^n$.

12. The encoder of claim 11, wherein
the first variable length code comprises a first prefix of variable length, and
the second variable length code comprises a second prefix based on n first prefixes.

13. The encoder of claim 12, wherein the second prefix corresponds to the code length of the second variable length code.

14. The encoder of claim 12, wherein the code length of the second variable length code is capable of being derived by using the second prefix as the index.

15. The encoder of claim 12, wherein
the second variable length code comprises the second prefix and a second suffix of variable length, and
the code converter comprises a conversion table configured to convert the n first prefixes into the second prefix and the second suffix.

16. The encoder of claim 15, wherein the code converter comprises a table generator configured to generate the conversion table, and
the table generator is configured to:
enumerate all combinations of the first prefixes generated by the first variable length codes;
group combinations having a same total bit length among the combinations to generate a group;
assign a different second prefix to each group;
set a bit length of the second suffix to ceil $\{\log 2(|Dk|)\}$ (herein, ceil represents a ceiling function and Dk represents the number of combinations belonging to the group) bits for each group; and
assign a different second suffix to each of the combinations belonging to the group to generate the conversion table.

17. The encoder of claim 15, wherein the code converter comprises a table generator configured to generate the conversion table, and
the table generator is configured to:
enumerate all combinations of the first prefixes generated by the first variable length codes;
group combinations having a same total bit length among the combinations;
assign a different second prefix to each two consecutive groups;
set a bit length of the second suffix to ceil $\{\log 2(|Dk|+|Dk+1|)\}$ (herein, ceil represents a ceiling function and |Dk| and |Dk+1| represent the number of combinations belonging to the consecutive two groups) for each consecutive two groups when following equation (1) is satisfied;
set the bit length of the second suffix to ceil $\{\log 2(|Dk|)\}$ for each consecutive two groups when following equation (1) is not satisfied; and
assign a different second suffix to each of the combinations belonging to the two consecutive groups to generate the conversion table $$Lp(a) \geq \text{ceil}\{\log 2(|Dk|+|Dk+1|)\}, a \in Dk \qquad (1)$$

wherein Lp(a) represents a total bit length of a combination of the prefixes in a group Dk.

18. The encoder of claim 15, wherein
the first variable length code comprises the first prefix and a first suffix of fixed length, and
the code converter combines n first suffixes with the second prefix and the second suffix, to generate the second variable length code.

19. A decoder configured to decode the encoded stream generated by the encoder according to claim 11, the decoder comprising:
a code length deriving module configured to derive the code length of the second variable length code by using a part of the second variable length code as the index;
a cutout module configured to cut out the second variable length code from the encoded stream based on the derived code length;
a code reverse-converter configured to convert the second variable length code into the n first variable length codes; and
a variable length decoder configured to decode the first variable length code to generate the output data.

20. The decoder of claim 19, wherein the code length deriving module derives the code length of the second variable length code using a table indicating a relationship between the index and the code length of the second variable length code.

* * * * *